(12) United States Patent
Paul et al.

(10) Patent No.: US 10,672,806 B2
(45) Date of Patent: Jun. 2, 2020

(54) HIGH-Q INTEGRATED CIRCUIT INDUCTOR STRUCTURE AND METHODS

(71) Applicant: pSemi Corporation, San Diego, CA (US)

(72) Inventors: Abhijeet Paul, Poway, CA (US); Hiroshi Yamada, San Diego, CA (US); Alain Duvallet, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/040,411

(22) Filed: Jul. 19, 2018

(65) Prior Publication Data

US 2020/0027908 A1 Jan. 23, 2020

(51) Int. Cl.
*H01L 23/528* (2006.01)
*H01L 27/13* (2006.01)
(Continued)

(52) U.S. Cl.
CPC ........ *H01L 27/13* (2013.01); *H01L 21/76251* (2013.01); *H01L 21/84* (2013.01); *H01L 28/10* (2013.01)

(58) Field of Classification Search
CPC .................................................. H01L 2224/94
See application file for complete search history.

(56) References Cited

U.S. PATENT DOCUMENTS 5,633,182 A 5/1997 Miyawaki et al.
7,180,019 B1 2/2007 Chiou et al.
(Continued)

FOREIGN PATENT DOCUMENTS

EP 1453093 9/2004
EP 2814053 12/2014
(Continued)

OTHER PUBLICATIONS

Le, Thao P., Notice of Allowance received from the USPTO dated Aug. 20, 2019 for U.S. Appl. No. 16/040,390, 14 pgs.
(Continued)

*Primary Examiner* — Thao P Le
(74) *Attorney, Agent, or Firm* — Jaquez Land Greenhaus LLP; John Land, Esq.

(57) ABSTRACT

FET IC structures that enable formation of high-Q inductors in a "flipped" SOI IC structure made using a back-side access process, such as an single layer transfer (SLT) process. Essentially, the interconnect layer superstructure of an IC is split into two parts, a "lower" superstructure and an "upper" superstructure. In various embodiments, one or more low-resistance interconnect layers are fabricated within an upper superstructure formed after the application of a back-side access process, allowing fabrication of inductors in one or more low-resistance interconnect layer. A significant advantage of such IC structures is that the low-resistance interconnect layer or layers are relocated from being near the handle wafer of a conventional SLT IC to being spaced away from the handle wafer by intervening structures. Fabricating inductors in such spaced low-resistance interconnect layer or layers reduces electromagnetic coupling with the handle wafer and thus increases the Q factor of the inductors.

20 Claims, 11 Drawing Sheets

(51) Int. Cl.
   *H01L 21/84*     (2006.01)
   *H01L 21/762*    (2006.01)
   *H01L 49/02*     (2006.01)

(56) References Cited

U.S. PATENT DOCUMENTS

| | | | |
|---|---|---|---|
| 9,530,798 | B1 | 12/2016 | Chou et al. |
| 9,755,029 | B1 | 9/2017 | Goktepeli |
| 9,780,210 | B1 | 10/2017 | Goktepeli et al. |
| 9,837,412 | B2* | 12/2017 | Tasbas .................... H01L 29/45 |
| 9,960,098 | B2 | 5/2018 | Olson |
| 10,573,674 | B2 | 2/2020 | Paul et al. |
| 10,580,903 | B2 | 3/2020 | Yamada et al. |
| 2005/0242884 | A1 | 11/2005 | Anand |
| 2008/0020488 | A1 | 1/2008 | Clevenger et al. |
| 2008/0079037 | A1 | 4/2008 | Zhu et al. |
| 2008/0277778 | A1 | 11/2008 | Furman et al. |
| 2009/0010056 | A1* | 1/2009 | Kuo .................... G11C 16/0408 365/184 |
| 2012/0146193 | A1 | 6/2012 | Stuber et al. |
| 2012/0193752 | A1 | 8/2012 | Purushothaman et al. |
| 2013/0037922 | A1 | 2/2013 | Arriagada et al. |
| 2013/0270678 | A1 | 10/2013 | Rankin et al. |
| 2014/0191322 | A1 | 7/2014 | Botula et al. |
| 2014/0264468 | A1 | 9/2014 | Cheng et al. |
| 2015/0255368 | A1 | 9/2015 | Costa |
| 2016/0141228 | A1 | 5/2016 | Leobandung |
| 2016/0336344 | A1 | 11/2016 | Mason et al. |
| 2016/0336990 | A1 | 11/2016 | Petzold et al. |
| 2017/0201291 | A1 | 7/2017 | Gu et al. |
| 2017/0373026 | A1 | 12/2017 | Goktepeli |
| 2018/0025970 | A1 | 1/2018 | Kao et al. |
| 2018/0151487 | A1* | 5/2018 | Venugopal .......... H01L 23/5226 |
| 2018/0158405 | A1 | 6/2018 | Agostinelli et al. |
| 2018/0240797 | A1 | 8/2018 | Yokoyama et al. |
| 2019/0288006 | A1 | 9/2019 | Paul et al. |
| 2019/0288119 | A1 | 9/2019 | Yamada et al. |
| 2020/0027898 | A1 | 1/2020 | Paul et al. |
| 2020/0027907 | A1 | 1/2020 | Paul et al. |

FOREIGN PATENT DOCUMENTS

| | | |
|---|---|---|
| EP | 3203507 | 8/2017 |
| JP | 2017174846 | 9/2017 |
| WO | 2011008893 | 1/2011 |
| WO | 2016183146 | 11/2016 |
| WO | 2017038403 | 3/2017 |
| WO | 2020018471 | 1/2020 |
| WO | 2020018847 | 1/2020 |

OTHER PUBLICATIONS

Yamada, et al., "Semiconductor-on-Insulator Transistor with Improved Breakdown Characteristics", patent application filed in the USPTO on Mar. 13, 2018, U.S. Appl. No. 15/920,321, 45 pgs.
Mazumder, Didarul A., Office Action received from the USPTO dated Feb. 11, 2019 for U.S. Appl. No. 15/920,321, 20 pgs.
Englekirk, et al., "Managed Substrate Effects for Stabilized SOI FETS", U.S. Patent Application filed in the USPTO on May 19, 2017, U.S. Appl. No. 15/600,588, 62 pgs.
Celler, et al., "Frontiers of Silicon-on-Insulator", Journal of Applied Physics, vol. 93, No. 9, May 1, 2003, pp. 4955-4978 (25 pgs).
Paul, et al., "Thermal Extraction of Single Layer Transfer Integrated Circuits", application filed in the USPTO on Jul. 19, 2018, U.S. Appl. No. 16/040,295, 44 pgs.
Paul, et al., "SLT Integrated Circuit Capacitor Structure and Methods", application filed in the USPTO on Jul. 19, 2018, U.S. Appl. No. 16/040,390, 43 pgs.
Mazumder, Didarul A., Notice of Allowance received from the USPTO dated Nov. 20, 2019 for U.S. Appl. No. 15/920,321, 13 pgs.
Le, Thao P., Notice of Allowance received from the USPTO dated Dec. 18, 2019 for U.S. Appl. No. 16/040,390, 17 pgs.
Wirner, Christoph, International Search Report and Written Opinion received from the EPO dated Oct. 22, 2019 for appln. No. PCT/US2019/041898, 11 pgs.
Topol, A., et al., Enabling SOI-based Assembly Technology for Three-Dimensional (3D) Integrated Circuits (ICs), International Electron Devices Meeting, Dec. 5, 2005, International Electron Devices Meeting 2005.
Wirner, Christoph, International Search Report and Written Opinion received from the EPO dated Oct. 28, 2019 for appln. No. PCT/US2019/042486, 14 pgs.
Huynh, Andy, Office Action received from the USPTO dated Oct. 25, 2019 for U.S. Appl. No. 16/040,295, 41 pgs.
Huynh, Andy, Office Action received from the USPTO dated Sep. 9, 2019 for U.S. Appl. No. 16/040,295, 5 pgs.
Office Action received from the USPTO dated Mar. 22, 2019 for U.S. Appl. No. 16/040,390, 11 pgs.
Meierewert, Klaus, Invitation to Pay Additional Fees and, Where Applicable, Protest Fee received from the EPO dated Jun. 28, 2019 for appln. No. PCT/US2019/021698, 13 pgs.
Notice of Allowance received from the USPTO dated Jun. 5, 2019 for U.S. Appl. No. 16/040,390, 7 pgs.
Mazumder, Didarul A., Final Office Action received from the USPTO dated Jun. 5, 2019 for U.S. Appl. No. 15/920,321, 31 pgs.
Huynh, Andy, Notice of Allowance received from the USPTO dated Apr. 3, 2020 for U.S. Appl. No. 16/040,295, 30 pgs.

* cited by examiner

HIGH-Q INTEGRATED CIRCUIT INDUCTOR STRUCTURE AND METHODS

CROSS-REFERENCE TO RELATED APPLICATIONS

The present application may be related to the following patents and patent applications, the contents of all of which are incorporated herein by reference:

Co-pending U.S. patent application Ser. No. 15/920,321, filed Mar. 13, 2018, entitled "Semiconductor-on-Insulator Transistor with Improved Breakdown Characteristics";

Co-pending U.S. patent application Ser. No. 16/040,295, filed Jul. 19, 2018, entitled "Thermal Extraction of Single Layer Transfer Integrated Circuits"; and Co-pending U.S. patent application Ser. No. 16/040,390, filed Jul. 19, 2018, entitled "SLT Integrated Circuit Capacitor Structure and Methods".

BACKGROUND

(1) Technical Field

This invention relates to electronic integrated circuits, and more particularly to electronic integrated circuits having transistors fabricated with semiconductor-on-insulator technology.

(2) Background

Virtually all modern electronic products—including laptop computers, mobile telephones, and electric cars—utilize complementary metal oxide semiconductor (CMOS) transistor integrated circuits (ICs), and in many cases CMOS ICs fabricated using a semiconductor-on-insulator process, such as silicon-on-insulator (SOI) or germanium-on-insulator. SOI transistors in which the electrical insulator is aluminum oxide (i.e., sapphire) are called silicon-on-sapphire or "SOS" devices. Another example of a semiconductor-on-insulator technology is "silicon-on-glass", and other examples are known to those of ordinary skill in the art.

Taking SOI as one example of semiconductor-on-insulator, SOI technology encompasses the use of a layered silicon-insulator-silicon substrate in place of conventional "bulk" silicon substrates in semiconductor manufacturing. More specifically, SOI transistors are generally fabricated on a layer of silicon dioxide, $SiO_2$ (often called a "buried oxide" or "BOX" layer) formed on a bulk silicon substrate. The BOX layer reduces certain parasitic effects typical of bulk silicon CMOS processes, thereby improving performance. SOI-based devices thus differ from conventional bulk silicon devices in that the silicon regions of the CMOS transistors are fabricated on an electrical insulator (typically silicon dioxide or aluminum oxide) rather than on a bulk silicon substrate.

As a specific example of a semiconductor-on-insulator process for fabricating ICs, FIG. 1 is a stylized cross-sectional view of a typical prior art SOI IC structure 100 for a single metal-oxide-semiconductor (MOS) field effect transistor (FET), or MOSFET. The SOI structure 100 includes a substrate 102, a buried-oxide (BOX) insulator layer 104, and an active layer 106 (note that the dimensions for the elements of the SOI IC structure 100 are not to scale; some dimensions have been exaggerated for clarity or emphasis). The substrate 102 is typically a semiconductor material such as silicon. The BOX layer 104 is a dielectric, and is often $SiO_2$ formed as a "top" surface 102T of the silicon substrate 102, such as by oxidation, layer transfer, or implantation. The active layer 106 may include some combination of implants and/or layers that include dopants, dielectrics, polysilicon, metal wiring, passivation, and other materials to form active and/or passive electronic components and/or mechanical structures. For example, in the illustrated embodiment, a FET (encircled by a dashed oval 108) is shown, with the FET 108 comprising a source S, a drain D, and a primary gate G atop an insulating gate oxide (GOX) layer 110. A body B is defined below the primary gate G, between the source S and the drain D. In operation, a "conduction channel" (for an enhancement mode FET) or an "inversion channel" (for a depletion mode FET) is generated within the body B between the source S and the drain D and proximate the GOX layer 110 (e.g., within about the top 100Å of the body B). A body contact (not shown), which generally comprises a region with the same doping as the body B, may be resistively coupled to the body B through an extension of the semiconductor island typically extending in the width direction of the transistor (in FIG. 1, that would be in/out of the plane of the image) to provide a fourth terminal to the FET 108. As is known, the body contact is commonly coupled to a bias node such as a power supply, to circuit ground, or to the source S (although other connection nodes are possible). If an SOI transistor has a body contact, it is known as body-contacted transistor, otherwise it is known as a floating-body transistor.

If the source S and drain D are highly doped with N type material, the FET is an N-type FET, or NMOS device. Conversely, if the source S and drain D are highly doped with P type material, the FET is a P-type FET, or PMOS device. Thus, the source S and drain D doping type determines whether a FET is an N-type or a P-type. CMOS devices comprise N-type and P-type FETs co-fabricated on a single IC die, in known fashion. The gate G is typically formed from polysilicon.

The BOX layer 104, the active layer 106, and one or more FETs 108 may be collectively referred to as a "device region" 114 for convenience (noting that other structures or regions may intrude into the device region 114 in particular IC designs). A superstructure 112 of various elements, regions, and structures may be fabricated in known fashion on or above the device region 114 in order to implement particularly functionality. The superstructure 112 may include, for example, conductive interconnections from the FET 108 to other components (including other FETs) and/or external contacts, passivation layers and regions, and protective coatings. The conductive interconnections may be, for example, copper or other suitable metal or electrically conductive material. Other elements, regions, and structures may be included for particular circuit designs. The formation of various layers creates a physical coupling between adjacent layers, which may include bonds at the atomic or molecular level and/or merging of layers (e.g., by implantation of dopants or the like).

As should be appreciated by one of ordinary skill in the art, a single IC die may embody from one electronic component—such as FET 108—to millions of electronic components. Further, the various elements of the superstructure 112 may extend in three-dimensions and have quite complex shapes. In general, the details of the superstructure 112 will vary from IC design to IC design.

The BOX layer 104, while enabling many beneficial characteristics for SOI IC's, also introduces some problems, such as capacitive coupling to the substrate 102, a thermal barrier to heat flow, and a voltage breakdown path to the substrate 102. Capacitive coupling with the substrate 102 alone can cause numerous side effects compared to an ideal SOI transistor, such as increased leakage current, lower breakdown voltage, signal cross-coupling, and linearity degradation. However, the most serious capacitive coupling effect caused by the BOX layer 104 is often the "back-channel" effect.

Referring back to FIG. 1, the structure of a secondary parasitic back-channel FET (shown in a dashed square 120) is formed by the source S, the drain D, the BOX layer 104 (functioning as a gate insulator), and the substrate 102 (effectively functioning as a secondary gate). Accordingly, the secondary parasitic back-channel FET 120 is coupled in parallel with the primary FET 108. Notably, the voltages and charge accumulations in and around the secondary gate (i.e., the substrate 102) may vary and in general are not well controlled. As is widely known, the presence of the secondary parasitic back-channel FET 120 adjacent the FET 108 can place the bottom of the FET 108 in uncontrolled states, often in a subthreshold leakage regime, which in turn may create uncontrollable source-drain leakage currents.

It is possible to mitigate some of the side effects of the secondary parasitic back-channel FET 120. One known mitigating technique utilizes "single layer transfer", or SLT, as part of the IC fabrication process. The SLT process essentially flips or inverts an entire SOI transistor structure upside down onto a "handle wafer", with the original substrate (e.g., substrate 102 in FIG. 1) then being removed, thereby eliminating the substrate 102. For example, FIG. 2 is a stylized cross-sectional view of a typical prior art SOI IC structure 100 for a single FET, fabricated using an SLT process. Essentially, after most or all of the superstructure 112 of FIG. 1 is completed, a first passivation layer 202 (e.g., SiO$_2$) is generally applied on top of the superstructure 112, and then the original substrate 102 and the layers denoted as "X" in FIG. 1 are flipped over and attached or bonded in known fashion to a handle wafer 204, as shown in FIG. 2. The handle wafer 204 is typically silicon with a bonding layer of SiO$_2$ (e.g., thermally grown oxide) on the surface facing the first passivation layer 202. Thereafter, the original substrate 102 is removed (e.g., by mechanical and/or chemical means), thus exposing the BOX layer 104. A non-conductive second passivation layer 206, which may be a conventional interlayer dielectric (ILD) material, may be formed on the exposed BOX layer 104.

In the structure of FIG. 2, the device region 114 is inverted with respect to the device region in FIG. 1. Thus, the portions of the FET 108 formerly closest to the original substrate 102 are now found near the "new top" of the IC structure, farthest away from the handle wafer 204. Conversely, those portions of the FET 108 formerly farthest away from the original substrate 102 are now found in the interior of the IC structure, situated closest to the handle wafer 204. Consequently, the gate G (and thus connections to the gate) of the FET 108 is now oriented towards the handle wafer 204, and the BOX layer 104 in the structure of FIGS. 1A and 1B—previously adjacent to the original substrate 102—is now very close to the "new top" of the IC structure.

Although not exactly to scale, the BOX layer 104 in FIG. 1 exhibits relatively high capacitive coupling to the original substrate 102, causing the above-mentioned side effects. Referring to FIG. 2, while the BOX layer 104 is still present with the inverted IC structure, the "backside" of the FET 108 is now near the "new top" of the IC structure, but with no adjacent semiconductive "backside gate" material (i.e., the original substrate 102).

FIG. 3 is a stylized cross-sectional view of a SOI IC structure 300 for a single FET made using a back-side access process as taught in co-pending U.S. patent application Ser. No. 15/920,321, referenced above. In this example, the superstructure 112 is shown in greater detail, and includes conductive (e.g., metal) interconnect levels M1 (closest to the FET 108), M2, M3, M4, and M5 (also known as the "top metal"), which are separated in places by insulating and/or passivation layers or regions (generally indicated as "oxide", but other materials may be used). As is known in the art, the various layers of the superstructure 112 are generally sequentially formed, and more or fewer than five interconnect levels may be used. Interconnections between the interconnect layers may be made by one or more vertical conductive vias 310 or the like, in known fashion (not all of the vias 310 are labeled, to avoid clutter).

A contact 302 is made to the gate G of the FET 108, typically at the M1 level. In the illustrated example, the second passivation layer 206 has been patterned and covered in whole or in part by a top-side layer 304 of conductive material (commonly aluminum). The top-side layer 304 may be used, for example, to distribute high current power around an IC chip and for signal connections.

The thicker interconnect levels (e.g., M4 and M5) are generally lower in electrical resistance than the thinner interconnect levels (e.g., M1-M3), and are commonly used to convey power around an IC. Of note, in the illustrated example, the top layer interconnect level M5 is closer to the handle wafer 204 than is the M1 interconnect level. In contrast, in a conventional, non-SLT configuration, such as the type shown in FIG. 1, the M1 interconnect level is closer to the substrate 102 than is the M5 interconnect level.

As is taught in U.S. patent application Ser. No. 15/920,321, the top-side layer 304 also may be used to mitigate or eliminate the problems caused by the secondary parasitic back-channel FET of conventional FET IC structures. More particularly, embodiments of that invention enable full control of the secondary parasitic back-channel FET of semiconductor-on-insulator IC primary FETs by fabricating such ICs using a process which allows access to the backside of the FET, such as an SLT process (collectively, a "back-side access process"). Thereafter, as shown in FIG. 3, a conductive aligned supplemental (CAS) gate structure 306 is fabricated as part of the fabrication of the top-side layer 304 (the illustrated CAS gate structure 306 is shown in dashed outline to indicate that it is an optional element for a particular FET). The CAS gate structure 306 is formed relative to the BOX layer 104 and juxtaposed to a primary FET 108 such that a control voltage applied to the CAS gate structure 306 can regulate the electrical characteristics of the regions of the primary FET 108 adjacent the BOX layer 104. Such a FET may also be referred to as a "CAS-gated FET". As should be apparent, one IC may have a mixture of conventional FETs and CAS-gated FETs (including all of, or none of, either type).

While "flipped" SOI IC structures of the type shown in FIG. 3 (with or without CAS-gated FETs) have a number of advantages, one disadvantage is the difficulty of forming inductors having high quality (Q) factors. Accordingly, there is a need for FET IC structures that enable formation of high-Q inductors in a "flipped" SOI IC structure made using a back-side access process, such as an SLT process. The present invention addresses this need and more.

SUMMARY

The present invention encompasses FET IC structures that enable formation of high-Q inductors in a "flipped" SOI IC structure made using a back-side access process, such as an SLT process.

Essentially, the interconnect layer superstructure of an IC is split into two parts, a "lower" superstructure and an "upper" superstructure ("lower" and "upper" being with reference to the "new top" of an IC structure made using a back-side access process, such as the SLT process). Splitting the superstructure beneficially takes advantage of the realization that the interconnect layers are generally sequentially formed, and that a back-side access process can be applied at nearly any point of the process.

In one example embodiment, a single low-resistance interconnect layer is fabricated within an upper superstructure formed after the application of a back-side access process, allowing fabrication of inductors in the low-resistance interconnect layer. In another example embodiment, multiple low-resistance interconnect layers are fabricated within an upper superstructure formed after the application of a back-side access process, allowing fabrication of inductors in one or more low-resistance interconnect layer.

A significant advantage of IC structures in accordance with the present invention is that the low-resistance interconnect layer or layers are relocated from being near the handle wafer of a conventional SLT IC to being spaced away from the handle wafer by intervening structures. Fabricating inductors in such spaced low-resistance interconnect layer or layers reduces electromagnetic coupling with the handle wafer and thus increases the Q factor of the inductors.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The present invention encompasses FET IC structures that enable formation of high-Q inductors in a "flipped" or inverted SOI IC structure made using a back-side access process, such as an SLT process. Essentially, the interconnect layer superstructure of an IC is split into two parts, a "lower" superstructure and an "upper" superstructure ("lower" and "upper" being with reference to the "new top" of an IC structure made using a back-side access process, such as the SLT process). Splitting the superstructure beneficially takes advantage of the realization that the interconnect layers are generally sequentially formed, and that a back-side access process can be applied at nearly any point of the process.

In one example embodiment, a single low-resistance interconnect layer is fabricated within an upper superstructure formed after the application of a back-side access process, allowing fabrication of inductors in the low-resistance interconnect layer. In another example embodiment, multiple low-resistance interconnect layers are fabricated within an upper superstructure formed after the application of a back-side access process, allowing fabrication of inductors in one or more low-resistance interconnect layer.

A significant advantage of IC structures in accordance with the present invention is that the low-resistance interconnect layer or layers are relocated from being near the handle wafer of a conventional SLT IC to being spaced away from the handle wafer by intervening structures. Fabricating inductors in such spaced low-resistance interconnect layer or layers reduces electromagnetic coupling with the handle wafer and thus increases the Q factor of the inductors.

IC Inductors

Figure 4:
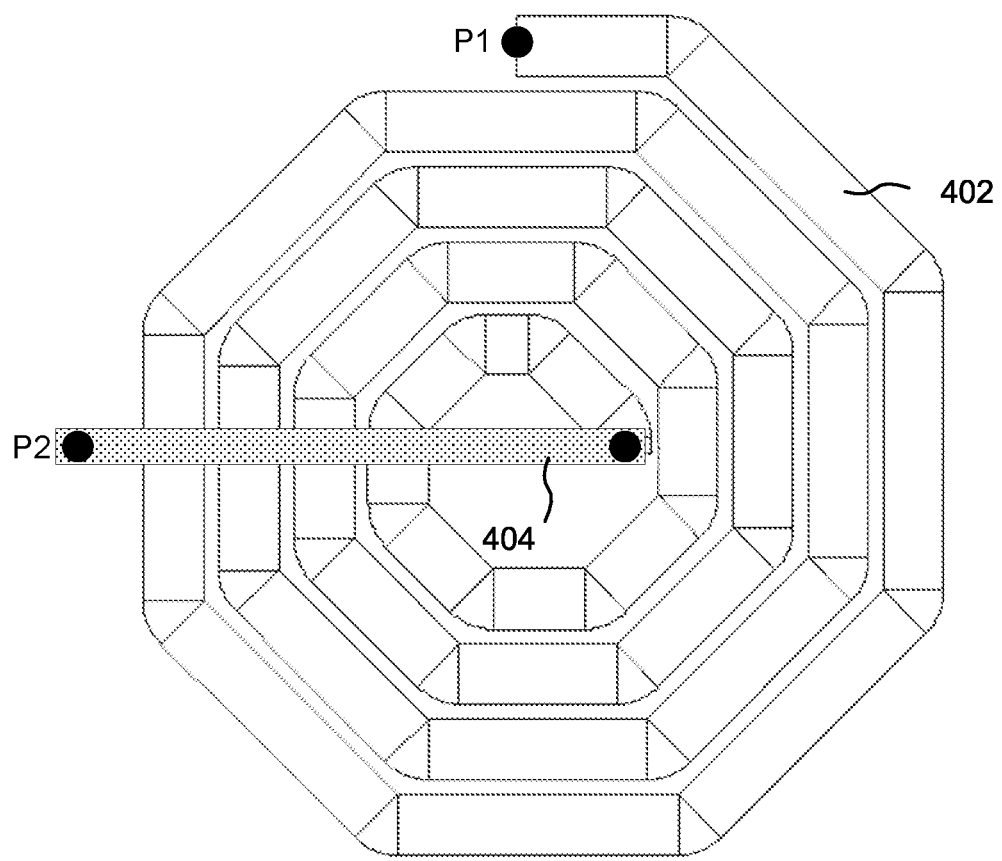
FIG. 4 is a depiction of the layout of one type of prior art inductor that may be used in an IC.

Inductors are widely used in alternating current electronic equipment, particularly in radio frequency (RF) equipment. FIG. 4 is a depiction of the layout of one type of prior art inductor 400 that may be used in an IC. In the illustrated example, the inductor 400 comprises a generally octagonal coil 402 of conductive material, such as copper or aluminum, having at least a first port P1 coupled near or to a first end of the coil 402, and at least a second port P2 coupled near or to a second end of the coil 402. Additional ports may be included between the first and second ports P1, P2 in a "multi-port" configuration, where the number of ports is greater than 2. When formed in an IC, the coupling of the second port P2 to the second end of the coil 402 may be through a different layer 404 of the IC structure, insulated from the main body of the coil 402 and electrically connected using vertical conductive vias or the like, in known fashion. Two such coils 400 may be formed in close enough proximity (e.g., vertically separated) so as to be mutually electromagnetically coupled sufficiently to be useful in circuits, particularly RF circuits. As should be appreciated, other configurations may be used to form a coil (e.g., spiraling squares, hexagons, and circles), and the coil elements need not all be in the same plane.

Even though inductor components are often assumed to be pure inductors, in practice they always have a finite amount of resistance. Such resistance affects the inductor quality factor, Q, and is one of the major factors affecting the performance of the inductor component. Any resistance will reduce the overall inductor Q factor, since Q equals the reactance of the inductor ($X_L$) divided by the resistance of the inductor (R): $Q=X_L/R$. Thus, lower resistance means higher Q, and accordingly IC inductors are preferably fabricated in low resistance materials.

Figure 1:
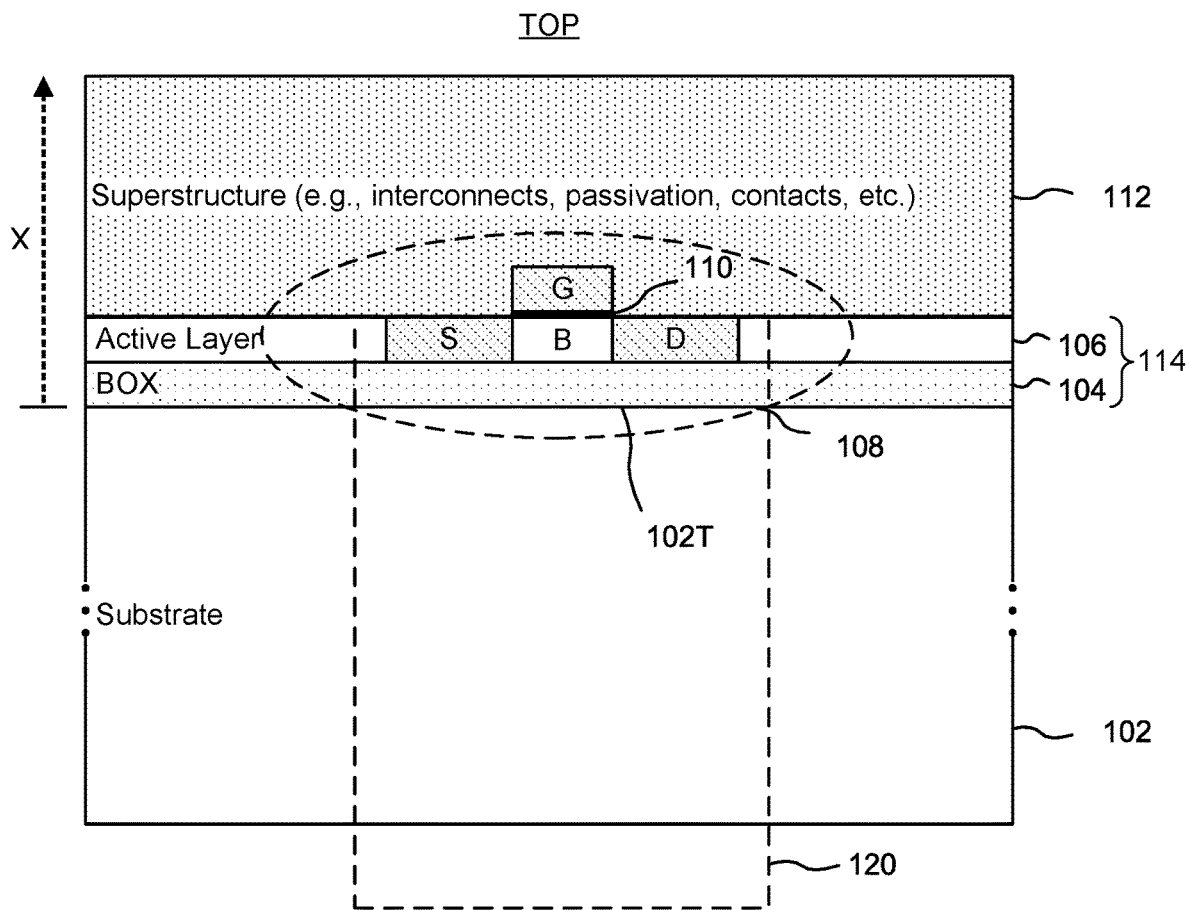
FIG. 1 is a stylized cross-sectional view of a typical prior art SOI IC structure for a single metal-oxide-semiconductor (MOS) field effect transistor (FET), or MOSFET.
Figure 2:
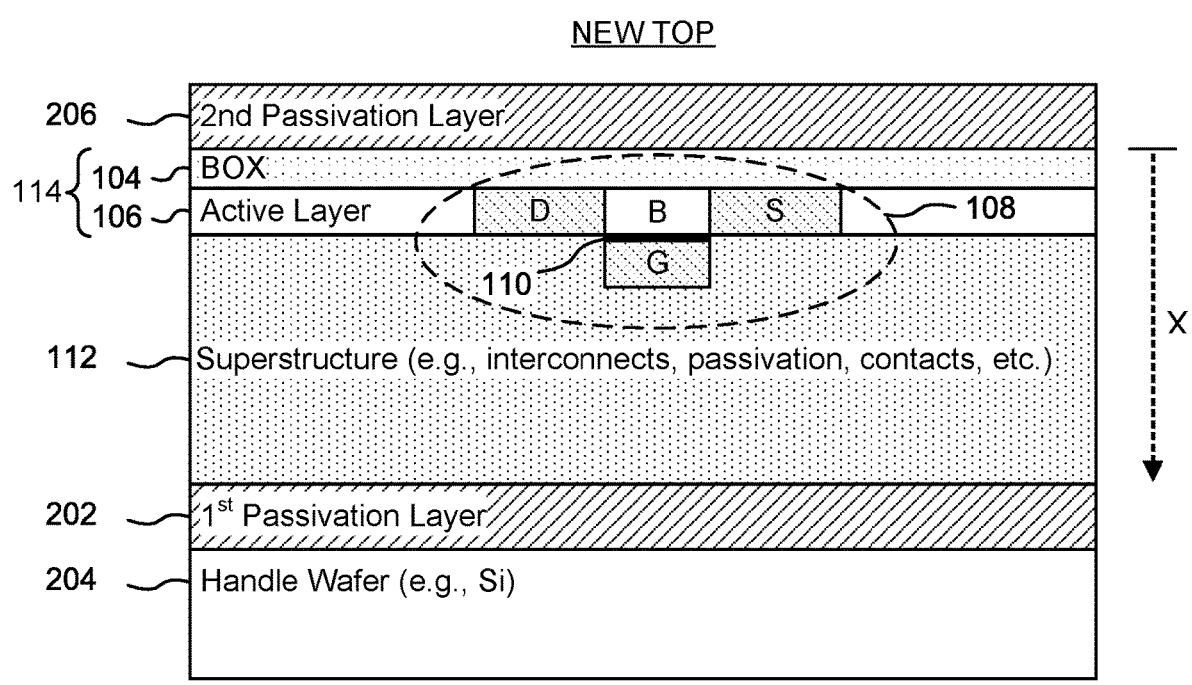
FIG. 2 is a stylized cross-sectional view of a typical prior art SOI IC structure for a single FET, fabricated using an SLT process.

In conventional ICs of the type shown in FIG. 1, inductors are typically made in the thickest (hence, lower resistance) interconnect levels (such as M5 and/or M4, which typically have a resistance of less than about 5-6 mohm/sq), so as to reduce the resistance of each coil 402 and thus improve the Q factor of such coils 402. In addition, inductors are typically formed far away from the substrate 102, which is typically made of silicon, and thus conductive to a degree. Current flowing through an inductor can electromagnetically couple to a conductive substrate 102, which dissipates energy and also reduces the Q factor of the inductor. Greater spacing from the substrate 102 reduces such electromagnetic coupling. Conveniently, in conventional ICs of the type shown in FIG. 1, the thickest, lowest resistance interconnect levels (e.g., M5, M4) are also farthest from the substrate 102.

Figure 3:
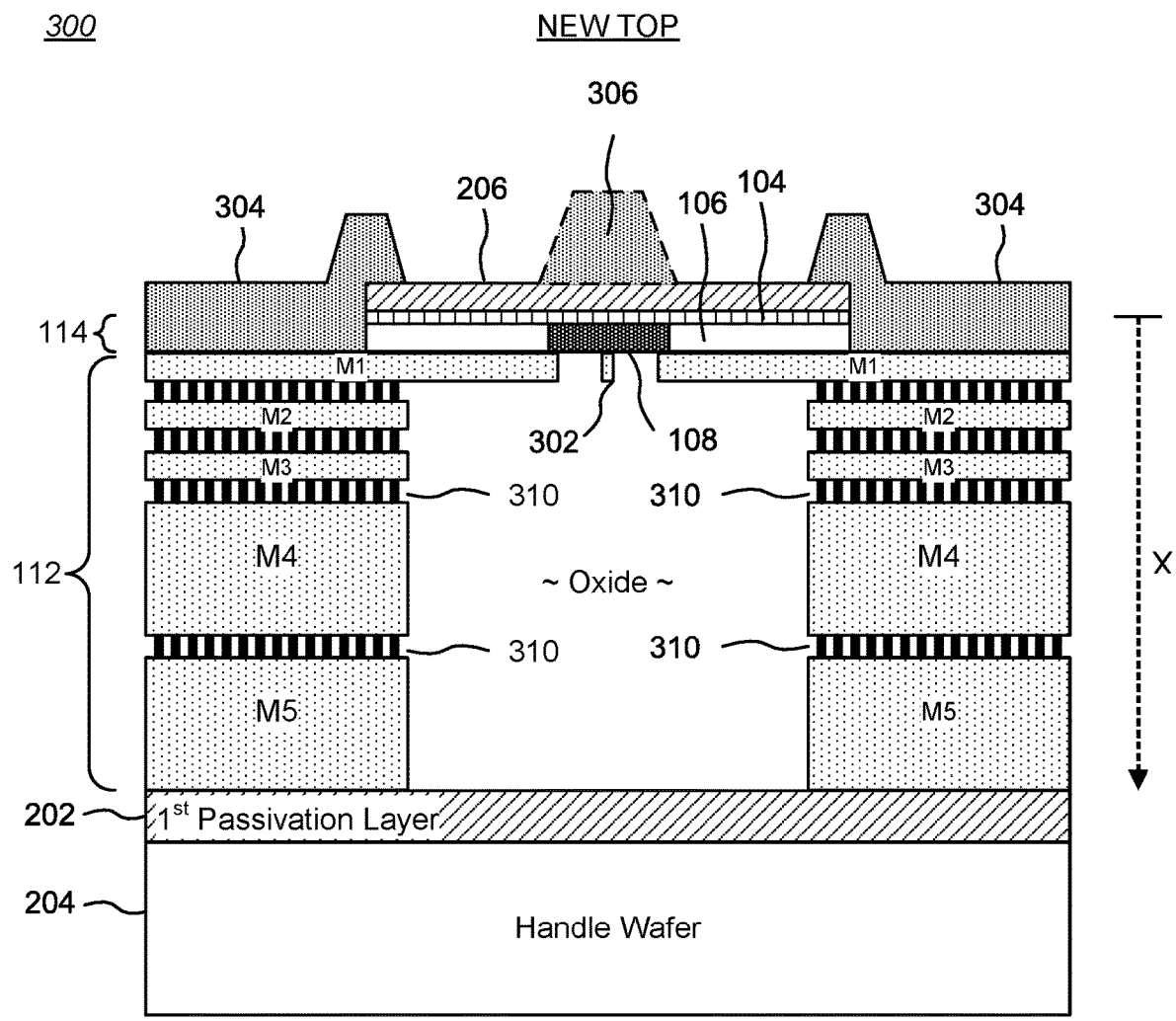
FIG. 3 is a stylized cross-sectional view of a SOI IC structure for a single FET made using a back-side access process as taught in co-pending U.S. patent application Ser. No. 15/920,321, referenced above.

However, as should be apparent from FIG. 3, in a "flipped" or inverted SOI IC structure made using a back-side access process, such as an SLT process, the thickest, lowest resistance interconnect levels (e.g., M5, M4) are in close proximity to the handle wafer 204. When the handle wafer 204 is made of silicon, such close proximity undesirably increases the electromagnetic coupling between inductors formed in the thickest, lowest resistance interconnect levels and the handle wafer 204, thus degrading the Q of inductors formed in such interconnect levels.

While handle wafers made of non-conducting material (e.g., glass, quartz, diamond) would not exhibit electromagnetic coupling with inductors formed in proximate interconnect levels, such handle wafers are currently quite expensive compared to conventional silicon wafers (currently, a factor of 10-12 difference). Further, some IC fabrication foundries are not set up to handle such less conventional materials. Accordingly, it is useful to use conventional silicon wafers for handle wafers, particularly inexpensive low resistivity silicon wafers.

Relative Dimensions and Orientations in the Drawings

With respect to the figures referenced in the examples below, note that the dimensions for the various elements are not to scale; some dimensions have been exaggerated vertically and/or horizontally for clarity or emphasis. In addition, references to orientations and directions (e.g., "top", "bottom", "above", "below", "lateral", "orthogonal" etc.) are relative to the example drawings, and not necessarily absolute orientations or directions.

First Example Upper Superstructure Inductor Architecture

Figure 5A:
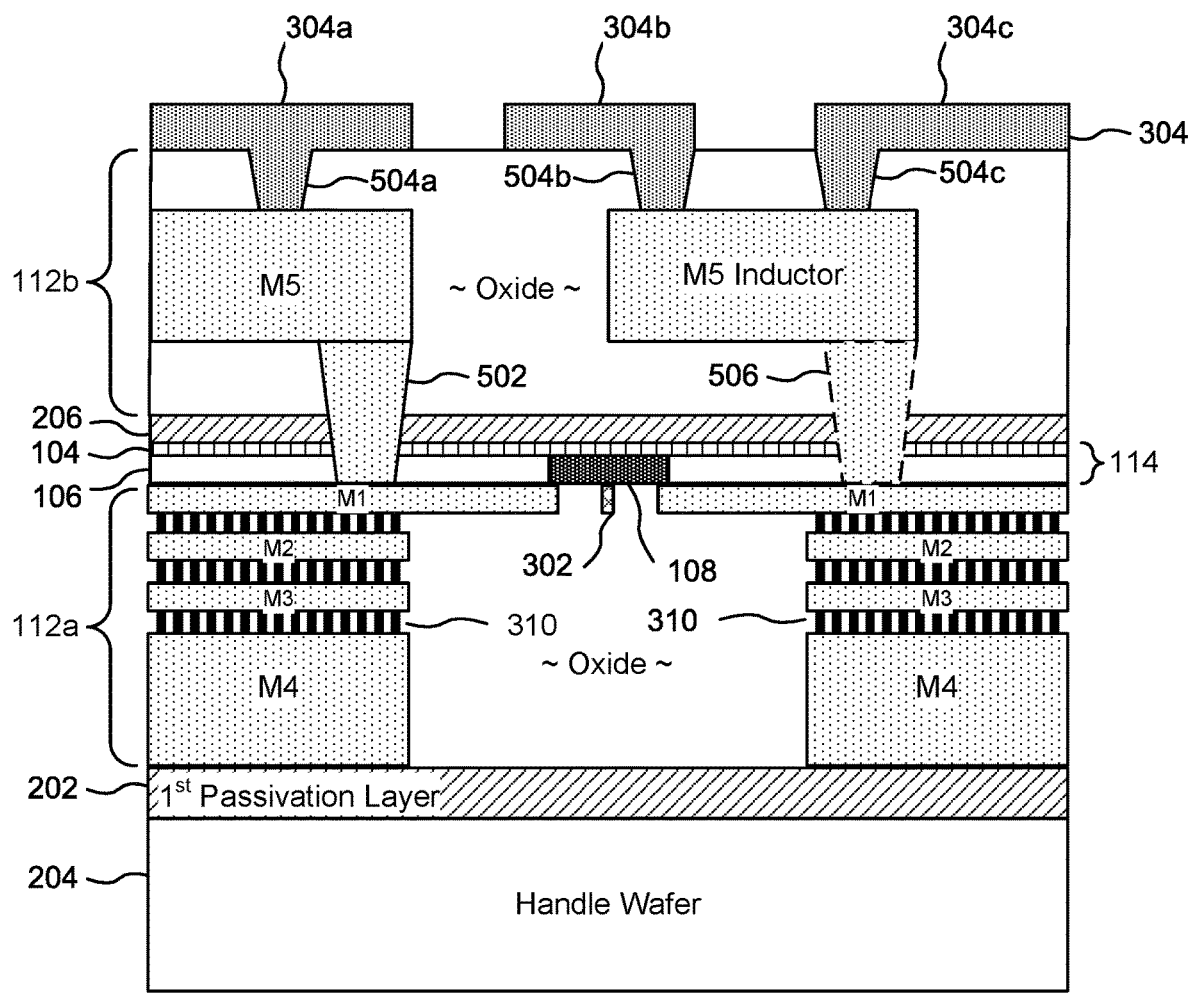
FIG. 5A is a stylized cross-sectional view of a SOI IC structure for a single FET made using a back-side access process and including a top-side M5 interconnect level in accordance with the present invention.

FIG. 5A is a stylized cross-sectional view of a SOI IC structure 500 for a single FET made using a back-side access process and including a top-side M5 interconnect level in accordance with the present invention. Essentially, the superstructure 112 of FIG. 3 is split into two parts, a "lower" superstructure 112a and an "upper" superstructure 112b, as shown in FIG. 5A ("lower" and "upper" being with reference to the "new top"). Splitting the superstructure 112 beneficially takes advantage of the realization that the interconnect layers are generally sequentially formed, and that a back-side access process can be applied at nearly any point of the process.

Figure 5B:
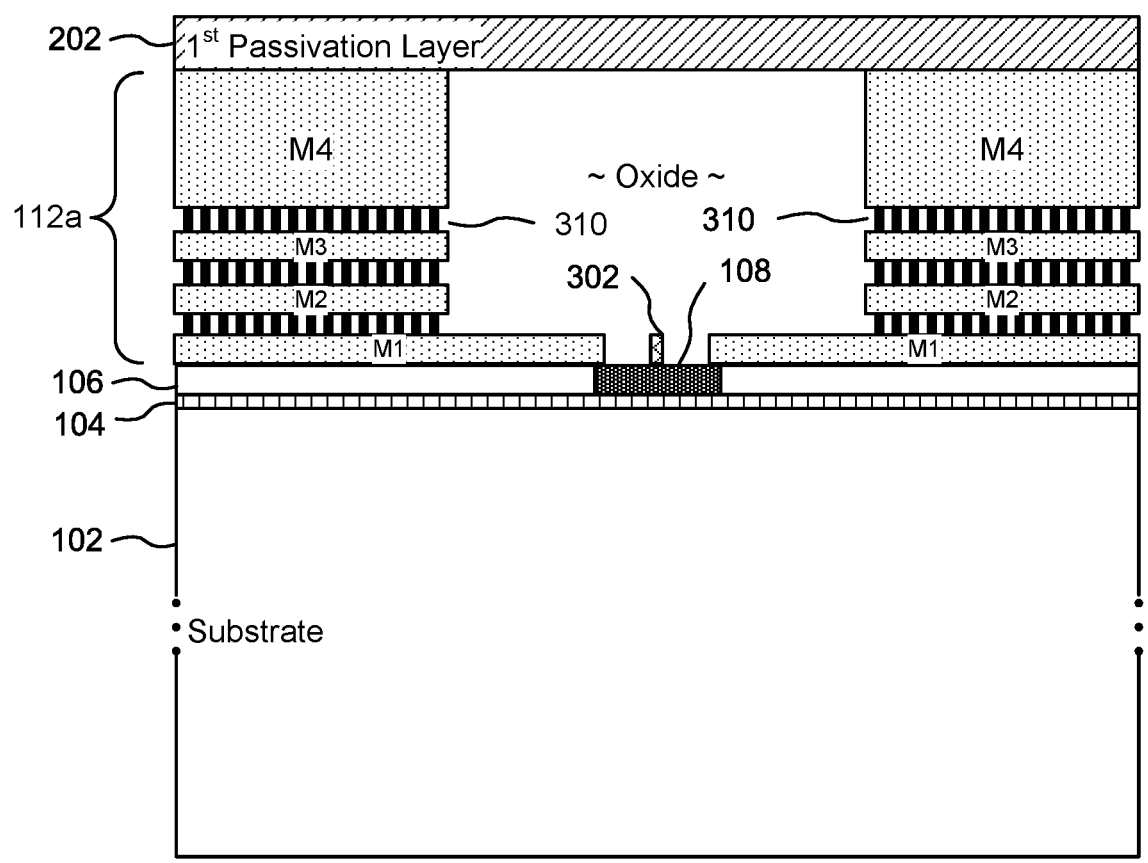
FIG. 5B is a stylized cross-sectional view showing a first intermediate step of fabrication of the SOI IC structure of FIG. 5A, in which conventional pre-SLT fabrication has been stopped after forming the first passivation layer over interconnect layer M4.

In the example shown in FIG. 5A, interconnect layers M1-M4 are formed in conventional fashion. At that point, the M5 interconnect layer is not formed (as in FIG. 3), and thus the lower superstructure 112a is a "shortened" or "truncated" version of the superstructure 112 of FIG. 3. Instead, a first passivation layer 202 is formed over the M4 interconnect layer. For example, FIG. 5B is a stylized cross-sectional view 520 showing a first intermediate step of fabrication of the SOI IC structure of FIG. 5A, in which conventional pre-SLT fabrication has been stopped after forming the first passivation layer 202 over interconnect layer M4. At this point, a back-side access process—in this case, an SLT process—is applied to invert the in-process transistor structure of FIG. 5B and bond the first passivation layer 202 onto a handle wafer 204, in known fashion. A second passivation layer 206 is then formed on the exposed BOX layer 104. For example, FIG. 5C is a stylized cross-sectional view 540 showing a second intermediate step of fabrication of the SOI IC structure of FIG. 5A, in which an SLT process has been applied to the pre-SLT SOI IC structure of FIG. 5B.

Figure 5C:
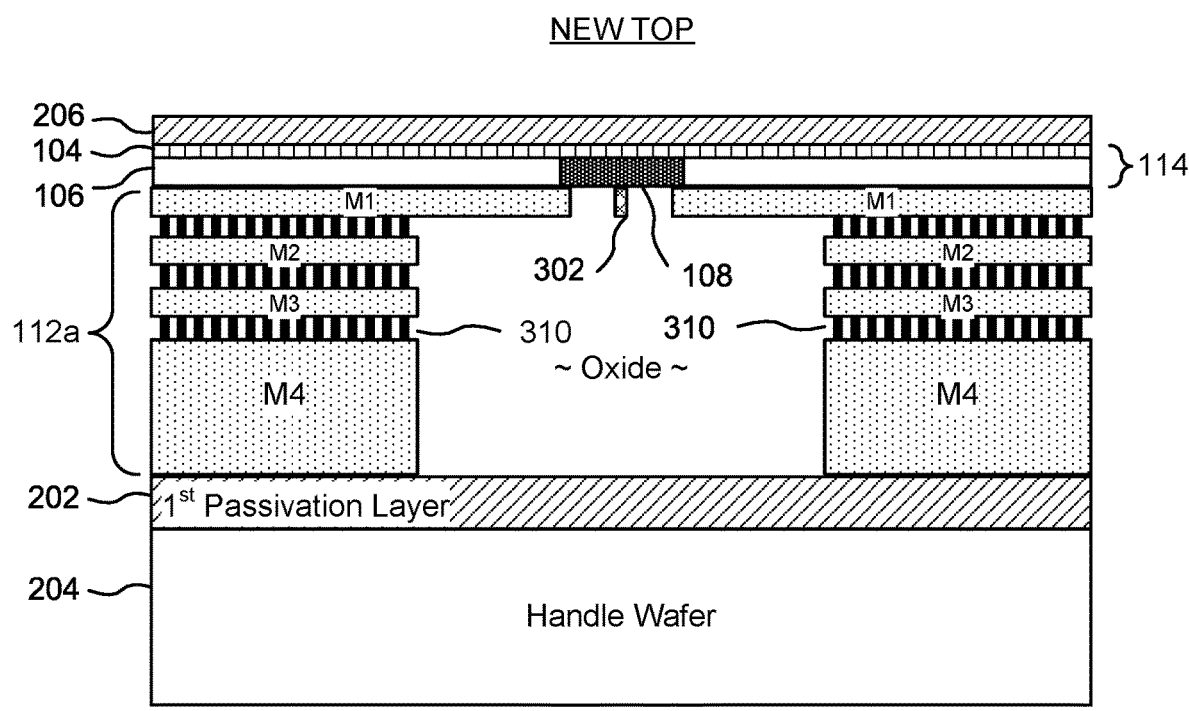
FIG. 5C is a stylized cross-sectional view showing a second intermediate step of fabrication of the SOI IC structure of FIG. 5A, in which an SLT process has been applied to the pre-SLT SOI IC structure of FIG. 5B.

After application of the SLT process step shown in FIG. 5C, the second passivation layer 206 is exposed and thus may be further processed. Referring back to FIG. 5A, the second part of the superstructure 112 (i.e., upper superstructure 112b) can be formed using conventional processing techniques. In the illustrated example, insulating oxide layers and an M5 interconnect layer are formed above the second passivation layer 206 (with respect to the view in FIG. 5A). As should be appreciated, the M5 interconnect layer is not a solid sheet of conductive material, but is patterned to provide needed electrical connections and signal pathways to various components and structures within the IC, and is generally spaced apart from the second passivation layer 206. Also shown is a via 502 connecting one part of the M5 interconnect layer to structures "below" the second passivation layer 206 (in this case, the M1 interconnect layer). Such vias may be formed in conventional fashion, such as by masking and etching holes and then back-filling such holes with a conductive material (e.g., copper). As should be clear, the need for and position of such vias depends on the design of each particular IC.

As illustrated in FIG. 5A, a top-side layer 304 of conductive material (e.g., aluminum) may be formed in conventional fashion to create electrical connections to different components and structures within the IC. The top-side layer 304 may also be referred to as a "redistribution layer", or RDL. As should be appreciated, like the M5 interconnect layer, the top-side layer 304 is not a solid sheet of conductive material, but is patterned to provide needed electrical connections and signal pathways to various components and structures within the IC. For example, in the illustrated embodiment, a section of the top-side layer 304a is coupled by a via 504a to a portion of the M5 interconnect layer.

Of particular note, the M5 interconnect layer in the upper superstructure 112b may be patterned to form one or more inductors each comprising a coil similar to the type shown in FIG. 4. One such inductor is shown in side view in FIG.

5A as the "M5 Inductor", which is electrically connected to other sections of the top-side layer 304b, 304c by corresponding vias 504b, 504c. Of course, a particular IC may include multiple M5 Inductors. A significant advantage of the IC structure shown in FIG. 5A is that the M5 interconnect layer is now relocated from being near the handle wafer 204 (as in FIG. 3) to being spaced away from the handle wafer 204 by intervening structures (i.e., in this example, the first passivation layer 202, the lower superstructure 112a, the active layer 106, the BOX layer 104, and the second passivation layer 206, as well as one or more oxide layers). In some IC designs, the intervening structures may also provide electromagnetic shielding for the interconnect layer in the upper superstructure 112b. Thus, an M5 Inductor is fabricated in a thick (hence, lower resistance) interconnect level and is spaced further from the handle wafer 204 than in a conventional SLT configuration (e.g., such as FIG. 3), thereby reducing electromagnetic coupling with the handle wafer 204 and thus increasing the Q factor of the M5 Inductor.

It should be appreciated that electrical connections to an M5 Inductor can be made in a variety of ways. For example, electrical connections may be made: solely from the top-side layer 304 (e.g., 304b, 304c); from the top-side layer 304 and, by means of one or more optional vias 506, directly to other interconnect layers through the second passivation layer 206 and other intervening structures; solely by means of one or more optional vias 506, directly to other interconnect layers through the second passivation layer 206 and other intervening structures; through other extents of the M5 interconnect layer; and/or any feasible combination of the above. Thus, a simple two-port or a multi-port M5 Inductor may be coupled to other components in an assortment of ways to accommodate the design and layout of a particular IC.

Second Example Upper Superstructure Inductor Architecture

The IC structure shown in FIG. 5A shows a configuration in which only one interconnect layer (M5) is formed in the upper superstructure 112b. However, embodiments of the invention can form more than one interconnect layer in the upper superstructure 112b.

Figure 6A:
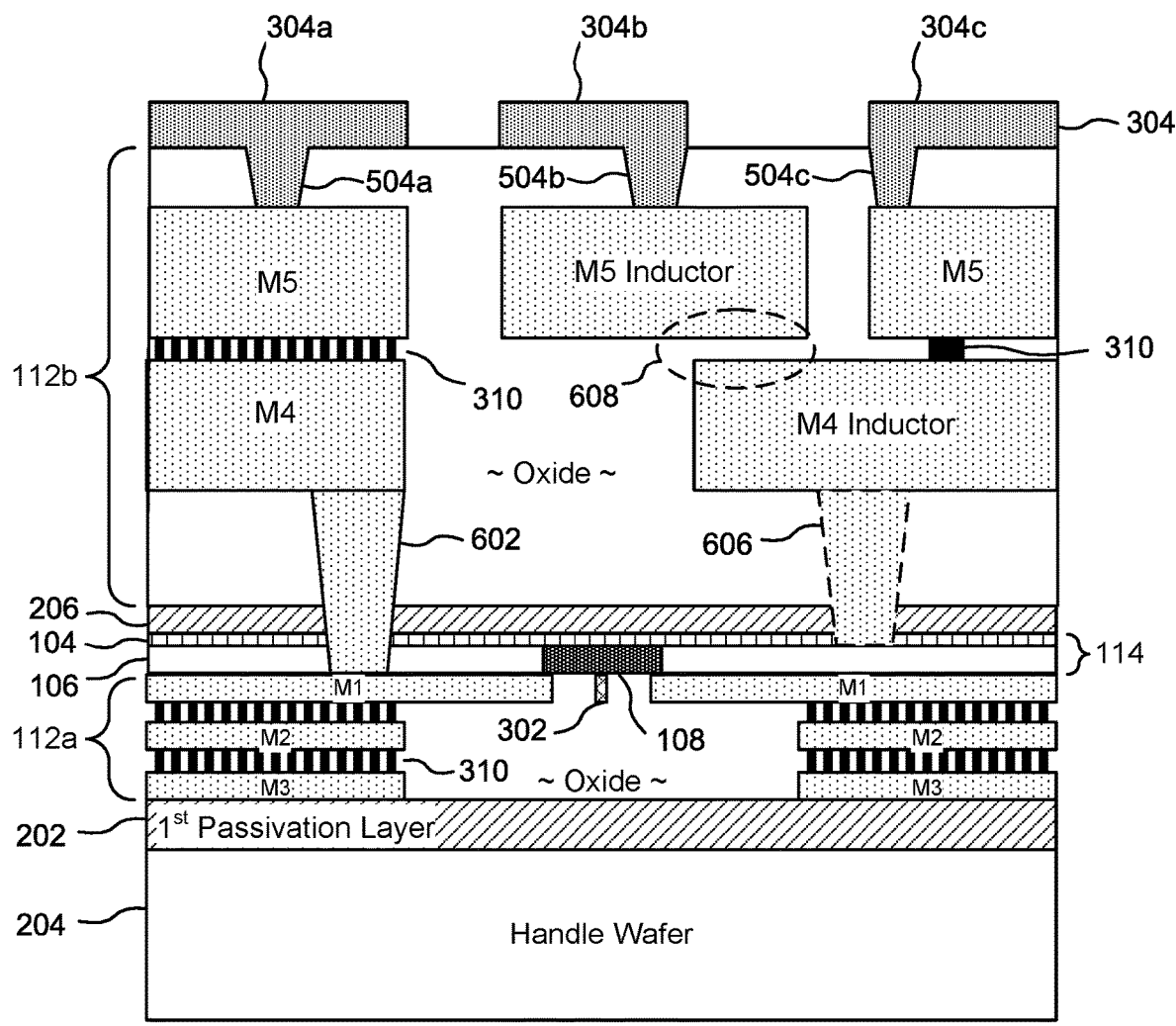
FIG. 6A is a stylized cross-sectional view of a SOI IC structure for a single FET made using a back-side access process and including top-side M5 and M4 interconnect levels in accordance with the present invention.

For example, FIG. 6A is a stylized cross-sectional view of a SOI IC structure 600 for a single FET made using a back-side access process and including top-side M5 and M4 interconnect levels in accordance with the present invention. Again, the superstructure 112 of FIG. 3 is essentially split into two parts, a "lower" superstructure 112a and an "upper" superstructure 112b, as shown in FIG. 6A (again, "lower" and "upper" being with reference to the "new top").

Figure 6B:
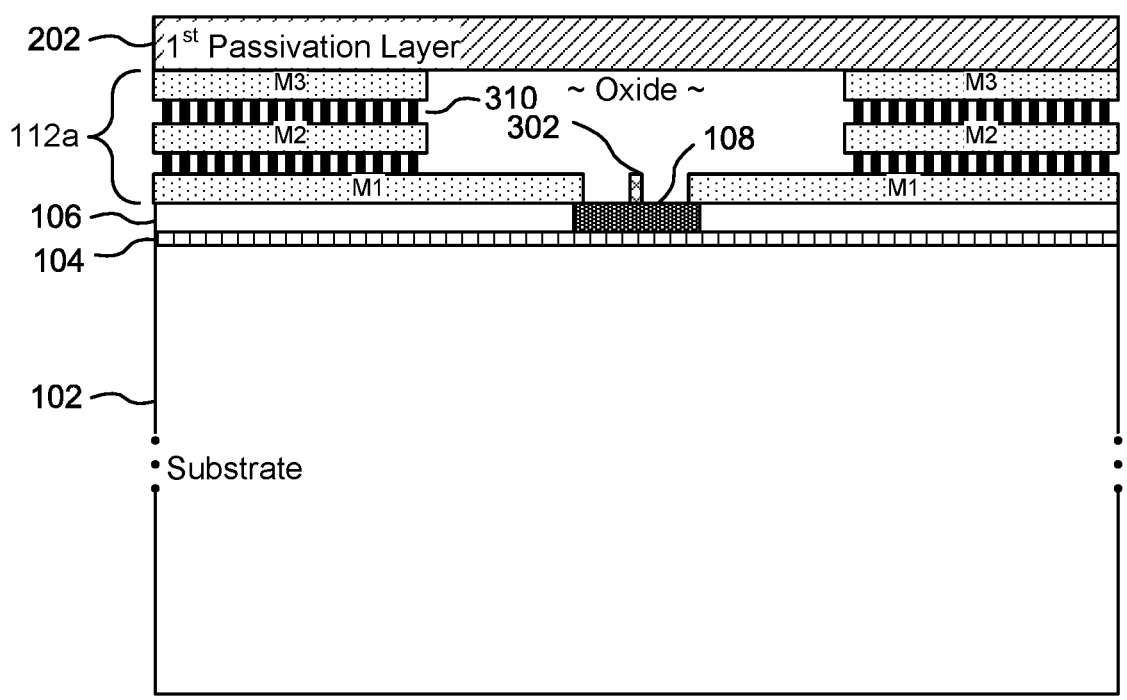
FIG. 6B is a stylized cross-sectional view showing a first intermediate step of fabrication of the SOI IC structure of FIG. 6A, in which conventional pre-SLT fabrication has been stopped after forming the first passivation layer over interconnect layer M3.

In the example shown in FIG. 6A, interconnect layers M1-M3 are formed in conventional fashion. At that point, the M4 and M5 interconnect layers are not formed (as in FIG. 3), and thus the lower superstructure 112a is a "shortened" or "truncated" version of the superstructure 112 of FIG. 3. Instead, a first passivation layer 202 is formed over the M3 interconnect layer. For example, FIG. 6B is a stylized cross-sectional view 620 showing a first intermediate step of fabrication of the SOI IC structure of FIG. 6A, in which conventional pre-SLT fabrication has been stopped after forming the first passivation layer 202 over interconnect layer M3. At this point, a back-side access process—in this case, an SLT process—is applied to invert the in-process transistor structure of FIG. 6B and bond the first passivation layer 202 onto a handle wafer 204, in known fashion. A second passivation layer 206 is then formed on the exposed BOX layer 104. For example, FIG. 6C is a stylized cross-sectional view 640 showing a second intermediate step of fabrication of the SOI IC structure of FIG. 6A, in which an SLT process has been applied to the pre-SLT SOI IC structure of FIG. 6B.

Figure 6C:
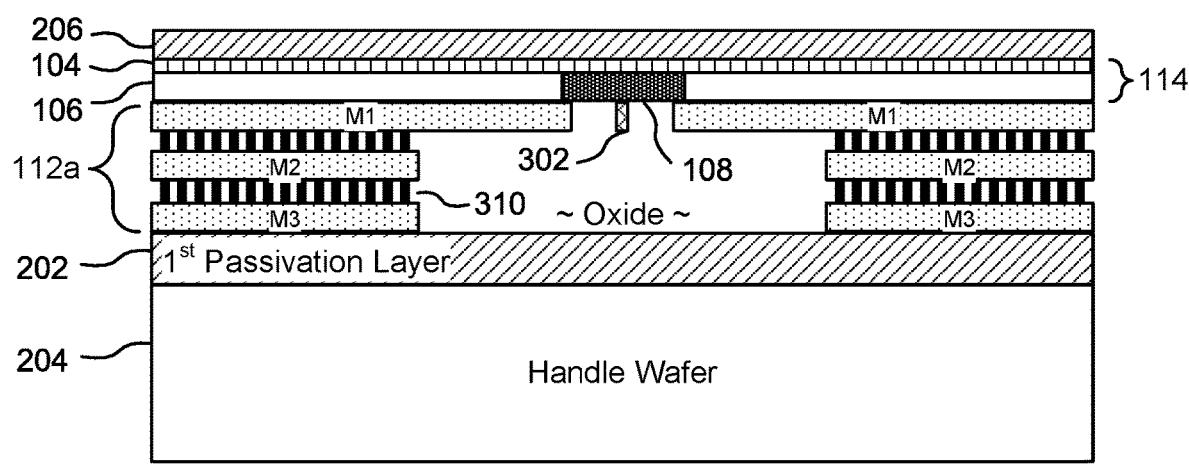
FIG. 6C is a stylized cross-sectional view showing a second intermediate step of fabrication of the SOI IC structure of FIG. 6A, in which an SLT process has been applied to the pre-SLT SOI IC structure of FIG. 6B.

After application of the SLT process step shown in FIG. 6C, the second passivation layer 206 is exposed and thus may be further processed. Referring back to FIG. 6A, the second part of the superstructure 112 (i.e., upper superstructure 112b) can be formed using conventional processing techniques. In the illustrated example, M4 and M5 interconnect layers and insulating oxide layers are formed above the second passivation layer 206. As with conventional processing, the M4 and M5 interconnect layers are generally sequentially formed, with the M4 interconnect layer being formed on the second passivation layer 206, and the M5 interconnect layer being insulated from, and formed above, the M4 interconnect layer.

The M4 and M5 interconnect layers are patterned to provide needed electrical connections and signal pathways to various components and structures within the IC. Vias 310 may be formed between various parts of the M4 and M5 interconnect layers suing conventional techniques. Also shown is a via 602 connecting one part of the M4 interconnect layer to structures "below" the second passivation layer 206 (in this case, the M1 interconnect layer). Again, the need for and position of such vias depends on the design of each particular IC.

As illustrated in FIG. 6A, a top-side layer 304 of conductive material (e.g., aluminum) may be formed in conventional fashion to create electrical connections to different components and structures within the IC. The top-side layer 304 is patterned to provide needed electrical connections and signal pathways to various components and structures within the IC. For example, in the illustrated embodiment, a section of the top-side layer 304a is coupled by a via 504a to a portion of the M5 interconnect layer.

Of particular note, either of both of the M4 and M5 interconnect layers in the upper superstructure 112b may be patterned to form one or more inductors each comprising a coil similar to the type shown in FIG. 4. Two such inductors are shown in side view in FIG. 6A as the "M5 Inductor" and the "M4 Inductor". The M5 Inductor is electrically connected to another section of the top-side layer 304b by a corresponding via 504b. The M4 Inductor is electrically connected to a portion of the M5 interconnect layer through a via 310, and that portion of the M5 interconnect layer is in turn electrically connected to yet another section of the top-side layer 304c by a corresponding via 504c.

Of course, a particular IC may include multiple M4 Inductors and/or M5 Inductors (as well as coupled inductors, which allow for more turns). A significant advantage of the IC structure shown in FIG. 6A is that the M4 and M5 interconnect layers are now relocated from being near the handle wafer 204 (as in FIG. 3) to being spaced away from the handle wafer 204 by intervening structures (i.e., in this example, the first passivation layer 202, the lower superstructure 112a, the active layer 106, the BOX layer 104, and the second passivation layer 206, as well as one or more oxide layers). In some IC designs, the intervening structures may also provide electromagnetic shielding for the interconnect layer in the upper superstructure 112b. Thus, an M4 Inductor or an M5 Inductor is fabricated in a thick (hence, lower resistance) interconnect level and is spaced further from the handle wafer 204 than in a conventional SLT configuration (e.g., such as FIG. 3), thereby reducing electromagnetic coupling with the handle wafer 204 and thus increasing the Q factor of the inductor.

It should be appreciated that electrical connections to an M4 Inductor or an M5 Inductor can be made in a variety of ways. For example, electrical connections may be made: solely from the top-side layer 304 (e.g., 304b, 304c indirectly); from the top-side layer 304 and, by means of one or more optional vias 606, directly to other interconnect layers through the second passivation layer 206 and other intervening structures; solely by means of one or more optional vias 606, directly to other interconnect layers through the second passivation layer 206 and other intervening structures; through other extents of the M4 and/or M5 interconnect layers, directly or through vias 310; and/or any feasible combination of the above. Thus, a simple two-port or a multi-port M4 Inductor or M5 Inductor may be coupled to other components in an assortment of ways to accommodate the design and layout of a particular IC.

In addition, because inductors can be made in adjacent interconnect layers, intentionally (as opposed to parasitically) electromagnetically coupled inductors can be formed, where "intentionally" means inductors having a coupling coefficient k greater than about 0.1. For example, in FIG. 6A, the M4 Inductor and M5 Inductor may be formed in close enough proximity so as to intentionally electromagnetically couple, such as in the general region indicated by the dashed oval 608. Electromagnetically coupled inductors may provide, for example, RF signal propagation with DC electrical isolation (e.g., a transformer—including a balun—configuration, which may be core-less or include a core of suitable material compatible with a selected IC fabrication process).

Benefits and Variations

A major benefit of IC structures of the type shown in FIG. 5A and FIG. 6A is that the Q factor of upper superstructure inductors is significantly improved over inductors fabricated in conventional SLT IC structures by spacing such upper superstructure inductors further away from the handle wafer 204 compared to conventional SLT ICs. By way of comparison, in a conventional non-SLT IC, the M5 interconnect layer may be spaced about 8-9 μm from the substrate 102; in a conventional SLT IC, the M5 interconnect layer may be spaced less than about 2 μm from the handle wafer 204; in embodiments of the present invention, the M5 interconnect layer (and thus M5 Inductors) may be spaced more than about 10 μm from the handle wafer 204 (accordingly, spacing by at least about 8 μm from the handle wafer 204 should be sufficient for many IC designs and applications). In terms of improvement of Q factor, in modeled IC circuit structures having comparably sized inductors formed (a) in the M5 interconnect layer of a conventional SLT IC and (b) in the M5 interconnect layer of an upper superstructure 112b fabricated in accordance with the present invention, the M5 Inductor in the upper superstructure 112b had a better Q factor by about 14-18%.

Another benefit of IC structures of the type shown in FIG. 5A and FIG. 6A is that the handle wafer 204 may be an inexpensive silicon wafer, and especially an inexpensive low resistivity silicon wafer (e.g., silicon wafers having a resistivity of less than about 200 ohms-cm).

It should be appreciated that the inventive concepts are not limited to ICs having only five interconnect layers, but more generally applies to embodiments in which one or more low-resistance interconnect layers are fabricated within an upper superstructure formed after the application of a back-side access process, allowing fabrication of inductors in one or more low-resistance interconnect layer. It should also be appreciated that the inventive concepts extend to embodiments in which one or more low-resistance interconnect layers are fabricated within an upper superstructure formed after the application of a back-side access process, whether or not inductors are also formed in such one or more low-resistance interconnect layers. As a general proposition, pre-SLT fabrication of an IC may be stopped at nearly any interconnect layer (particularly after the M1 interconnect layer), the first passivation layer 202 applied, and an SLT or SLT-like process applied, with additional interconnect layers formed within an upper superstructure of the IC after layer transfer.

While the particular IC examples shown in FIG. 5A and FIG. 6A do not show a CAS-gated FET, the superstructures 112b shown in FIG. 5A and FIG. 6A are compatible with CAS-gated FETs as taught in co-pending U.S. patent application Ser. No. 15/920,321, entitled "Semiconductor-on-Insulator Transistor with Improved Breakdown Characteristics" and referenced above. More particularly, one of the interconnect layers (e.g., M4 or M5), or an extension of an interconnect layer, may be applied directly to the second passivation layer 206 above (relative to the view in FIGS. 5A and 6A) the FET 108 to form a CAS-gate.

The heat extraction and transfer structures and methods taught in the co-pending U.S. Patent Application entitled "Thermal Extraction of Single Layer Transfer Integrated Circuits" and referenced above, may be applied to ICs fabricated in accordance with the split superstructure teachings of the present invention. Indeed, since the relatively thick interconnect layers (e.g., M5, or M4 and M5) of an upper superstructure 112b generally have low thermal resistivity as well as low electrical resistivity (particularly if formed from copper, for example), and are readily accessible from the "new top" of the IC structure, heat extraction and transfer in an IC may be significantly improved by combining the teachings of the present invention with the teachings of the co-pending U.S. Patent Application entitled "Thermal Extraction of Single Layer Transfer Integrated Circuits".

Embodiments of the present invention may include integrated circuit capacitor structures of the type described in co-pending U.S. Patent Application entitled "SLT Integrated Circuit Capacitor Structure and Methods and referenced above.

Uses

Circuits and devices made using IC structures in accordance with the present invention may be used alone or in combination with other components, circuits, and devices. Integrated circuit embodiments of the present invention may be encased in IC packages and/or or modules for ease of handling, manufacture, and/or improved performance.

Circuits and devices made using IC structures in accordance with the present invention are useful in a wide variety of larger radio frequency (RF) circuits for performing a range of functions. Such functions are useful in a variety of applications, such as radar systems (including phased array and automotive radar systems), radio systems, and test equipment. Such circuits may be useful in systems operating over some or all of the RF range (e.g., from around 20 kHz to about 300 GHz).

Radio system usage includes cellular radios systems (including base stations, relay stations, and hand-held transceivers) that use such technology standards as various types of orthogonal frequency-division multiplexing ("OFDM"), various types of quadrature amplitude modulation ("QAM"), Code Division Multiple Access ("CDMA"), Wide Band Code Division Multiple Access ("WCDMA"), Global System for Mobile Communications ("GSM"), Enhanced Data Rates for GSM Evolution (EDGE), Long Term Evolution ("LTE"), 5G New Radio ("5G NR"), as well as other radio communication standards and protocols.

In particular, the present invention is useful in portable battery-operated devices, such as cellular telephones, that would benefit from RF circuitry having high-Q inductors.

Methods

Figure 7:
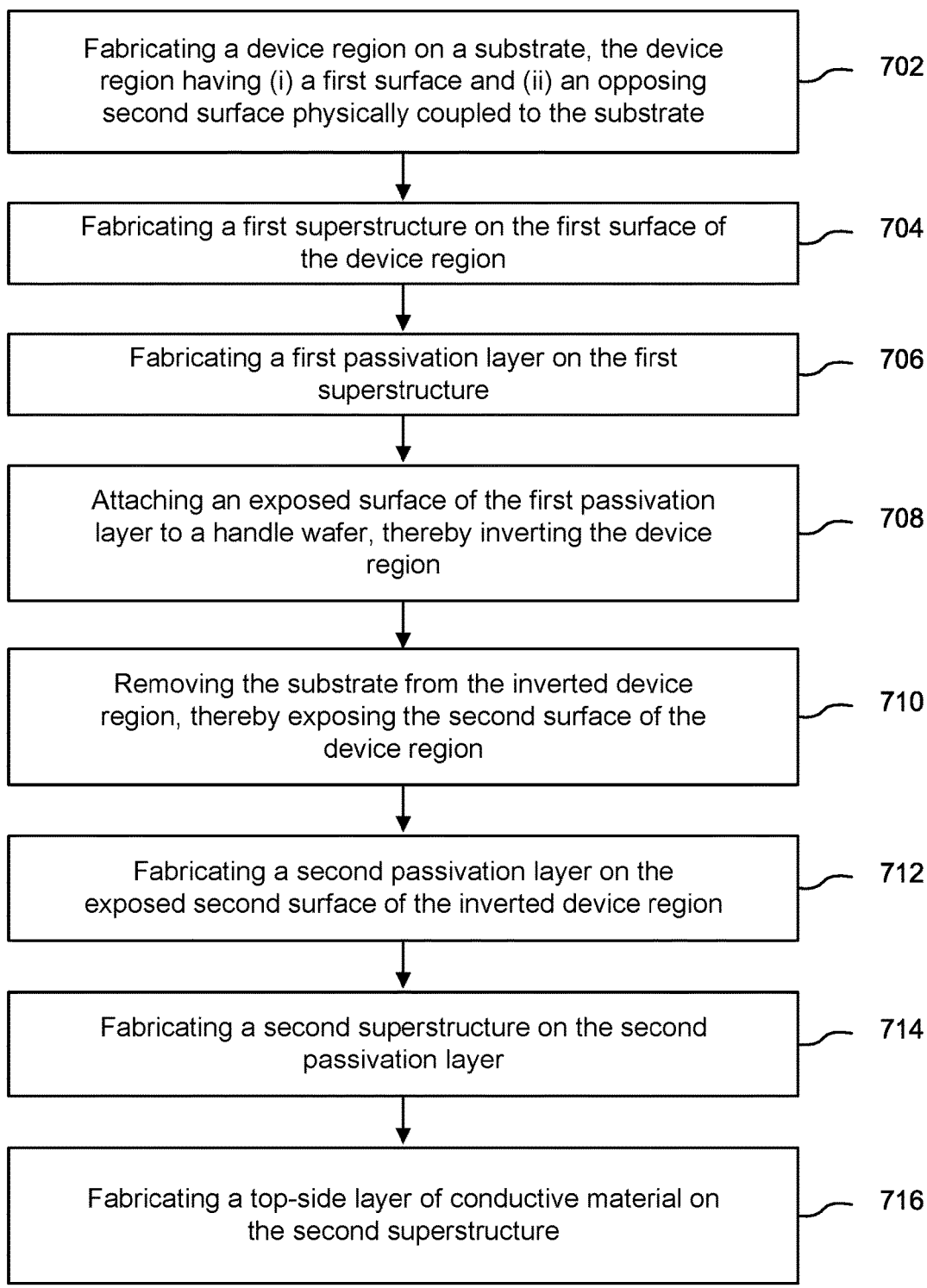
FIG. 7 is a process flow chart showing one method of fabricating an integrated circuit structure.

Another aspect of the invention includes methods for fabricating ICs with high Q factor inductors. For example, FIG. 7 is a process flow chart 700 showing one method of fabricating an integrated circuit structure, including: fabricating a device region on a substrate, the device region having (i) a first surface and (ii) an opposing second surface physically coupled to the substrate [Block 702]; fabricating a first superstructure on the first surface of the device region [Block 704]; fabricating a first passivation layer on the first superstructure [Block 706]; attaching an exposed surface of the first passivation layer to a handle wafer, thereby inverting the device region [Block 708]; removing the substrate from the inverted device region, thereby exposing the second surface of the device region [Block 710]; fabricating a second passivation layer on the exposed second surface of the inverted device region [Block 712]; fabricating a second superstructure on the second passivation layer [Block 714]; and fabricating a top-side layer of conductive material on the second superstructure [Block 716].

Other aspects of the inventive methods may include one or more of the following: wherein the second superstructure includes one or more low-resistance interconnect layers, and further including fabricating at least one inductor as part of at least one of the one or more low-resistance interconnect layers of the upper superstructure; wherein at least one inductor has a Q factor of at least about 16 at about 2.4 GHz, with some embodiments having at least one inductor having a Q factor as high as 30 at about 2.4 GHz; fabricating at least one inductor as a coil having at least a first port and a second port; wherein the second superstructure includes a plurality of low-resistance interconnect layers, further including fabricating at least one inductor as part of a first low-resistance interconnect layer of the second superstructure, and fabricating at least one inductor as part of a second low-resistance interconnect layer of the second superstructure; positioning at least one inductor fabricated as part of the first low-resistance interconnect layer sufficiently close to at least one inductor fabricated as part of the second low-resistance interconnect layer so as to electromagnetically couple; wherein the first superstructure includes one or more interconnect layers; fabricating at least one via to connect the second superstructure to the first superstructure through the second passivation layer and the inverted device region; fabricating at least one field effect transistor as part of the integrated circuit structure; fabricating, as part of the integrated circuit structure, at least one field effect transistor having a conductive aligned supplemental gate; fabricating the integrated circuit structure using a silicon-on-insulator process; wherein the handle wafer is principally silicon; wherein the handle wafer is principally silicon having a bonding layer of silicon dioxide, and the integrated circuit structure is attached to the bonding layer; and/or wherein the handle wafer includes a low resistivity silicon wafer.

Fabrication Technologies & Options

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An integrated circuit structure having a first side originally formed on a substrate, and an opposite second side, the first side being attached to a handle wafer and the opposite second side including one or more low-resistance interconnect layers fabricated within an upper superstructure formed after the application of a back-side access process.

2. The invention of claim 1, wherein the integrated circuit structure includes at least one field effect transistor.

3. The invention of claim 1, wherein the integrated circuit structure includes at least one field effect transistor having a conductive aligned supplemental gate.

4. The invention of claim 1, wherein the integrated circuit structure is fabricated using a silicon-on-insulator process.

5. The invention of claim 1, wherein the handle wafer is principally silicon.

6. The invention of claim 1, wherein the handle wafer is principally silicon having a bonding layer of silicon dioxide, and the integrated circuit structure is attached to the bonding layer.

7. The invention of claim 1, wherein the handle wafer includes a low resistivity silicon wafer.

8. An integrated circuit structure attached to a handle wafer and including one or more low-resistance interconnect layers fabricated within an upper superstructure formed after the application of a back-side access process, further including at least one inductor fabricated as part of at least one of the one or more low-resistance interconnect layers of the upper superstructure.

9. The invention of claim 8, wherein at least one inductor has a Q factor of at least about 16 at about 2.4 GHz.

10. The invention of claim 8, wherein at least one inductor comprises a coil having at least a first port and a second port.

11. The invention of claim 8, wherein the back-side access process includes a single layer transfer process.

12. The invention of claim 8, wherein the integrated circuit structure includes at least one field effect transistor.

13. The invention of claim 8, wherein the integrated circuit structure includes at least one field effect transistor having a conductive aligned supplemental gate.

14. The invention of claim 8, wherein the integrated circuit structure is fabricated using a silicon-on-insulator process.

15. The invention of claim 8, wherein the handle wafer is principally silicon.

16. The invention of claim 8, wherein the handle wafer is principally silicon having a bonding layer of silicon dioxide, and the integrated circuit structure is attached to the bonding layer.

17. The invention of claim 8, wherein the handle wafer includes a low resistivity silicon wafer.

18. An integrated circuit structure attached to a handle wafer and including one or more low-resistance interconnect layers fabricated within an upper superstructure formed after the application of a back-side access process, further including at least one inductor fabricated as part of a first one of the one or more low-resistance interconnect layers of the upper superstructure, and at least one inductor fabricated as part of a second one of the one or more low-resistance interconnect layers of the upper superstructure, wherein at least one inductor fabricated as part of the first one of the one or more low-resistance interconnect layers is positioned sufficiently close to at least one inductor fabricated as part of the second one of the one or more low-resistance interconnect layers so as to function as a transformer.

19. The invention of claim 18, wherein the integrated circuit structure includes at least one field effect transistor having a conductive aligned supplemental gate.

20. The invention of claim 18, wherein the handle wafer is principally silicon having a bonding layer of silicon dioxide, and the integrated circuit structure is attached to the bonding layer.

* * * * *